(12) United States Patent
Tamada et al.

(10) Patent No.: US 8,286,576 B2
(45) Date of Patent: Oct. 16, 2012

(54) SUBSTRATE PROCESSING APPARATUS

(75) Inventors: Osamu Tamada, Kyoto (JP); Masakazu Sanada, Kyoto (JP); Tadashi Miyagi, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 1036 days.

(21) Appl. No.: 12/242,296

(22) Filed: Sep. 30, 2008

(65) Prior Publication Data

US 2009/0269936 A1   Oct. 29, 2009

(30) Foreign Application Priority Data

Oct. 2, 2007   (JP) .................................. 2007-258693

(51) Int. Cl.
| | |
|---|---|
| B05C 11/02 | (2006.01) |
| B05C 11/00 | (2006.01) |
| B05B 1/28 | (2006.01) |
| C23C 16/00 | (2006.01) |

(52) U.S. Cl. ............ 118/72; 118/52; 118/612; 118/326; 118/58; 118/725

(58) Field of Classification Search ................... 118/600, 118/641–643, 695, 52, 612, 326, 56, 58, 118/72, 73, 725; 396/604, 611, 627; 427/240; 438/694

See application file for complete search history.

(56) References Cited

U.S. PATENT DOCUMENTS

| | | | | |
|---|---|---|---|---|
| 2005/0160990 | A1* | 7/2005 | Lubomirsky et al. | 118/728 |
| 2006/0291854 | A1* | 12/2006 | Kaneyama et al. | 396/604 |
| 2007/0212884 | A1* | 9/2007 | Yamamoto et al. | 438/694 |
| 2009/0023297 | A1* | 1/2009 | Salek | 438/758 |

FOREIGN PATENT DOCUMENTS

| | | |
|---|---|---|
| JP | 2007-005660 | 1/2007 |
| JP | 2007-096155 | 4/2007 |
| JP | 2007-096156 | 4/2007 |
| JP | 2007-214279 | 8/2007 |

* cited by examiner

*Primary Examiner* — Yewebdar Tadesse
(74) *Attorney, Agent, or Firm* — Kilpatrick Townsend & Stockton LLP

(57) ABSTRACT

A thermal processing unit of a thermal processor for anti-reflection films includes: a covering nozzle for covering a substrate from above supported by a thermal processing plate and discharging an adhesion enhancing agent to a periphery of a substrate supported by the thermal processing plate; and a vaporization processor for supplying an adhesion enhancing agent in the vapor phase to the covering nozzle. While a substrate placed over the thermal processing plate is being subjected to thermal process, a control part causes the covering nozzle to discharge an adhesion enhancing agent in the vapor phase onto a periphery of a substrate to realize adhesion enhancement process. Thus, the adhesion between a resist coating film and a substrate surface in the periphery of a substrate is enhanced. Further, parallel implementation of thermal process and adhesion enhancement process exerts no influence on throughput.

5 Claims, 9 Drawing Sheets

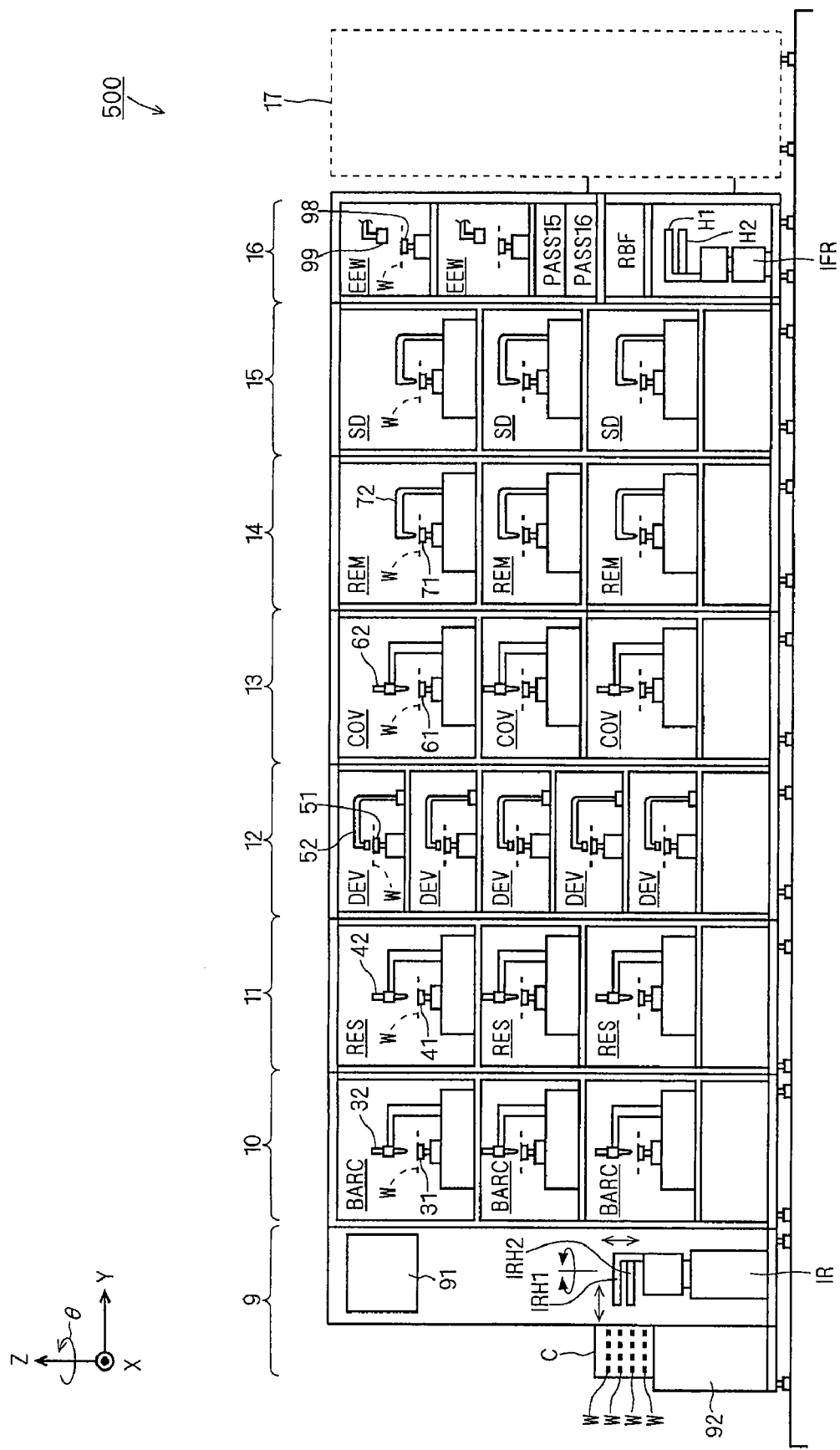
F I G . 2

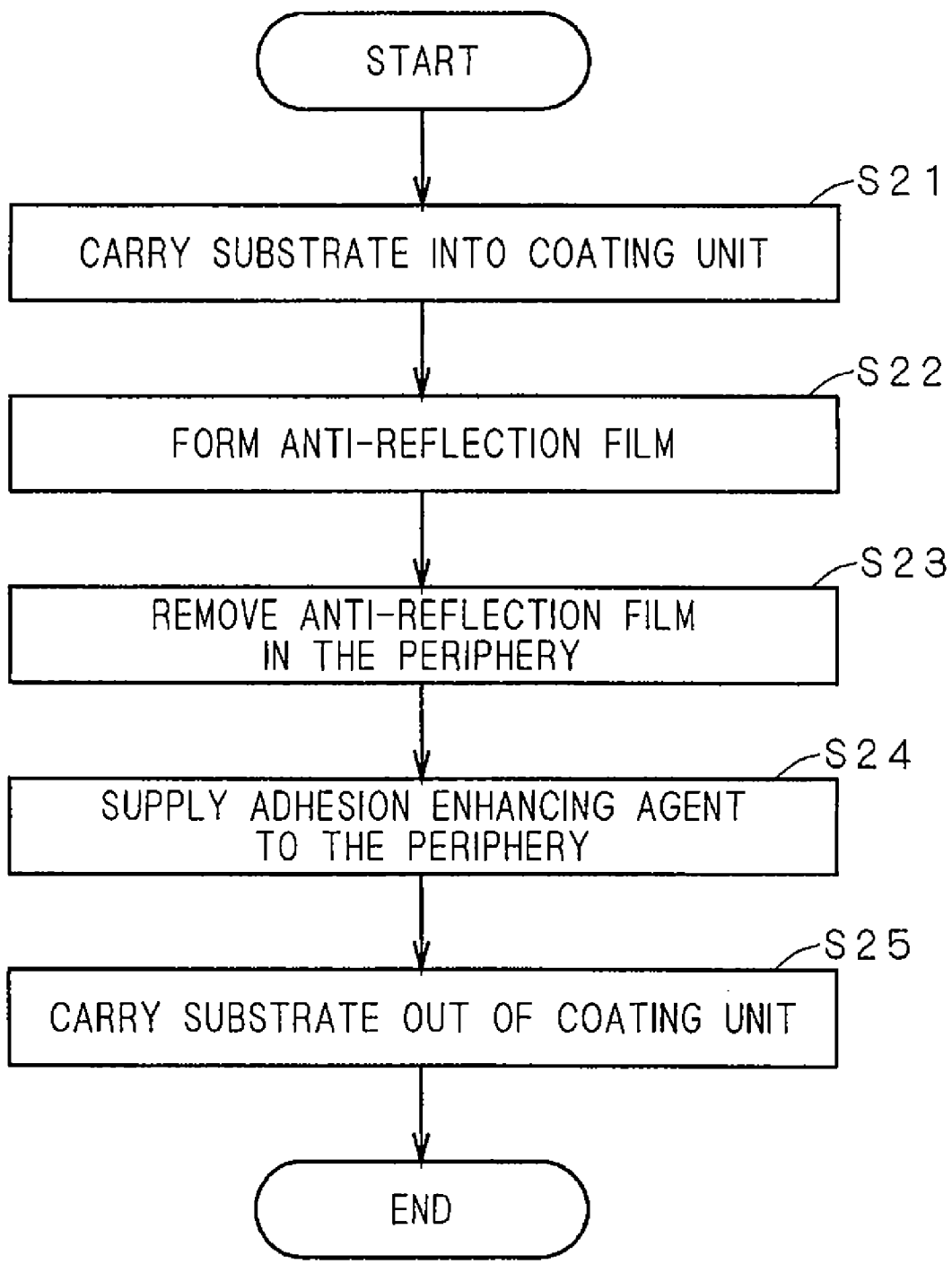

SUBSTRATE PROCESSING APPARATUS

CROSS-REFERENCES TO RELATED APPLICATIONS

This application claims priority to Japan Patent Application 2007-258693, filed Oct. 2, 2007. The disclosure of JP 2007-258693 is hereby incorporated by reference in its entirety for all purposes.

BACKGROUND OF THE INVENTION

The present invention relates to a technique of enhancing the adhesion between a substrate (such as a semiconductor substrate, a glass substrate for a liquid crystal display device, a glass substrate for a photomask) and a coating film formed on a surface of the substrate.

Products such as semiconductors and liquid crystal displays are manufactured by performing a series of process steps including cleaning, resist coating, exposure, development, etching, formation of interlayer dielectric films, thermal process, dicing and the like on substrates.

Rapid progress in the integration of semiconductor devices and the like in recent years requires finer patterns of resist masks. In response, as for a light source of an exposure device responsible for exposure process, a deep UV light source such as a KrF excimer laser light source or an ArF excimer laser light source for emitting light with a relatively short wavelength is becoming a mainstream light source in place of a conventionally employed ultraviolet lamp. However, even an ArF excimer laser light source cannot satisfactorily respond to the current need for still finer patterns. This may be satisfied by employing a light source with a shorter wavelength such as an F2 laser light source in the exposure device. Meanwhile, immersion exposure process has been suggested as an exposure technique that realizes much finer patterns while allowing reduction in cost burden.

In the immersion exposure process, a gap between a projection optical system and a substrate is filled with a liquid greater in refractive index n than air (n=1) such for example as pure water with a refractive index n=1.44, and then "immersion exposure" is performed. This increases a numerical aperture to realize resolution enhancement. According to this immersion exposure process, even with the use of a conventionally employed ArF excimer laser light source (with a wavelength of 193 nm), the equivalent wavelength is shortened to 134 nm. This realizes finer patterns of resist masks while suppressing the increase in cost burden.

When the immersion exposure process is employed, a liquid directly contacts a surface of a substrate at the time of exposure. In order to protect a resist film, a resist coating film is formed on a substrate surface in some cases. The resist coating film is arranged on the top layer of the resist film, and is removed at the time of development. A technique related to the formation and removal of a resist coating film is disclosed for example in Japanese Patent Application Laid-Open Nos. 2007-96155 and 2007-96156.

The adhesion between a resist coating film and a substrate is not generally strong. Thus, a resist coating film is quite likely to peel off from a substrate surface, which has been conventionally seen as a problem. If a formed resist coating film peels off prior to exposure, the protection of a resist film cannot be achieved.

SUMMARY OF THE INVENTION

The present invention is directed to a substrate processing apparatus arranged adjacent to an exposure device, wherein: a resist film is formed on an upper surface of a substrate; then a resist coating film is formed on an upper surface of the substrate; and the substrate is transferred to the exposure device. According to one aspect of the present invention, the substrate processing apparatus comprises: a processor with a plurality of processing units arranged therein that are responsible for certain process on a substrate. The plurality of processing units include a post-coating thermal processing unit responsible for thermal processing of a substrate after being coated with a certain coating solution applied to a surface of the substrate. The post-coating thermal processing unit has an adhesion enhancing agent supply element for supplying an adhesion enhancing agent only to a periphery of a substrate before formation of the resist coating film. The substrate processing apparatus comprises a transfer part for transferring a substrate between the processor and the exposure device.

According to this configuration, an adhesion enhancing agent is supplied only to a periphery of a substrate before formation of a resist coating film. This enhances the adhesion between a substrate and a resist coating film at a periphery of a substrate, thereby preventing the resist coating film from peeling off.

According to this configuration, the supply of an adhesion enhancing agent to a periphery of a substrate is performed in the post-coating thermal processing unit that is responsible for thermal processing of a substrate after being coated with the certain coating solution applied to a surface of the substrate.

Preferably, the post-coating thermal processing unit further has a thermal processing plate for performing a thermal process on a substrate while supporting the substrate by an upper surface of the thermal processing plate. The adhesion enhancing agent supply element is provided with: a cover for covering a substrate supported by the thermal processing plate; a partition wall configured to partition space inside the cover, while covering an inside portion of the substrate excluding a periphery of the substrate; and a discharge slot communicating with a feed path defined inside the cover and outside the partition wall while being opposite the periphery of the substrate. The adhesion enhancing agent guided along the feed path is discharged through the discharge slot toward the periphery of the substrate.

According to this configuration, an adhesion enhancing agent is guided along the feed path defined between the cover for covering a substrate and the partition wall for covering an inside portion of the substrate, and is discharged through the discharge slot opposite a periphery of the substrate. Thus the adhesion enhancing agent is reliably supplied only to the periphery of the substrate.

Preferably, the substrate processing apparatus further comprises: an inert gas supply element for supplying an inert gas from inside the partition wall to the inside portion of the substrate.

Preferably, the substrate processing apparatus further comprises: a control element for controlling each constituent of the post-coating thermal processing unit. The control element causes the adhesion enhancing agent supply element to supply the adhesion enhancing agent onto a periphery of a substrate while the thermal process is being performed on the substrate.

According to this configuration, an adhesion enhancing agent is supplied to a periphery of a substrate while the substrate is being subjected to the thermal process. This prevents film exfoliation in the vicinity of an edge of the substrate without exerting any influence on throughput.

Preferably, the certain coating solution serves to form an anti-reflection film.

Preferably, the certain coating solution serves to form a resist film.

Preferably, the adhesion enhancing agent supply element is provided with a vaporization element for vaporizing the adhesion enhancing agent. The adhesion enhancing agent is supplied in the vapor phase to the periphery of the substrate.

According to another aspect of the present invention, the substrate processing apparatus comprises: a processor with a plurality of processing units arranged therein that are responsible for certain process on a substrate. The plurality of processing units includes a coating processing unit for applying a certain coating solution to a surface of a substrate to form a coating film. The coating processing unit has: a holding member for rotating a substrate about a vertical axis while holding the substrate in a horizontal position; a coating solution supply element for supplying a certain coating solution to an upper surface of a substrate that is rotated by the holding member while being held by the holding member to form a coating film on the upper surface; a remover supply element for supplying a remover for removing the coating film to a periphery of a substrate coated with the coating film; an adhesion enhancing agent supply element for supplying an adhesion enhancing agent only to a periphery of a substrate before formation of the resist coating film; and a control element for controlling the coating processing unit. The control element causes the adhesion enhancing agent supply element to supply the adhesion enhancing agent to a periphery of a substrate after causing the remover supply element to supply the remover to the periphery of the substrate. The substrate processing apparatus comprises a transfer part for transferring a substrate between the processor and the exposure device.

According to this configuration, an adhesion enhancing agent is supplied only to a periphery of a substrate before formation of a resist coating film. This enhances the adhesion between a substrate and a resist coating film at a periphery of a substrate, thereby preventing the resist coating film from peeling off.

According to this configuration, the supply of an adhesion enhancing agent to a periphery of a substrate is performed in the coating processing unit for supplying the certain coating solution to a surface of the substrate.

Preferably, the coating processing unit further has a collection element for collecting a residual processing solution flying off from a substrate that is rotated by the holding member while being held by the holding member. The collection element is provided with: a first collection path for guiding the residual processing solution to a first collection container; a second collection path for guiding the residual processing solution to a second collection container; and a collection path switching element for guiding the residual processing solution to the first collection container when the residual processing solution is the adhesion enhancing agent, and guiding the residual processing solution to the second collection container when the residual processing solution is a processing solution other than the adhesion enhancing agent.

According to this configuration, an adhesion enhancing agent and a processing solution other than the adhesion enhancing agent are collected in the respective collection containers. This prevents the collected adhesion enhancing agent from being mixed with another processing solution in the collection container, thereby avoiding chemical reaction or solidification of a resin component caused by mixing.

Preferably, the coating film is an anti-reflection film.

Preferably, the coating film is a resist film.

Preferably, the adhesion enhancing agent supply element is provided with a vaporization element for vaporizing the adhesion enhancing agent. The adhesion enhancing agent is supplied in the vapor phase to the periphery of the substrate.

The present invention is also directed to a substrate processing method responsible for a series of process steps on a substrate, the process steps including formation of a resist film and formation of a resist coating film.

It is therefore an object of the present invention to provide a technique capable of preventing a resist coating film from peeling off.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a side view of the substrate processing apparatus as viewed from the +X side;

FIG. 9 shows the flow of process steps performed in the coating unit.

DETAILED DESCRIPTION OF THE INVENTION

Figure 1:
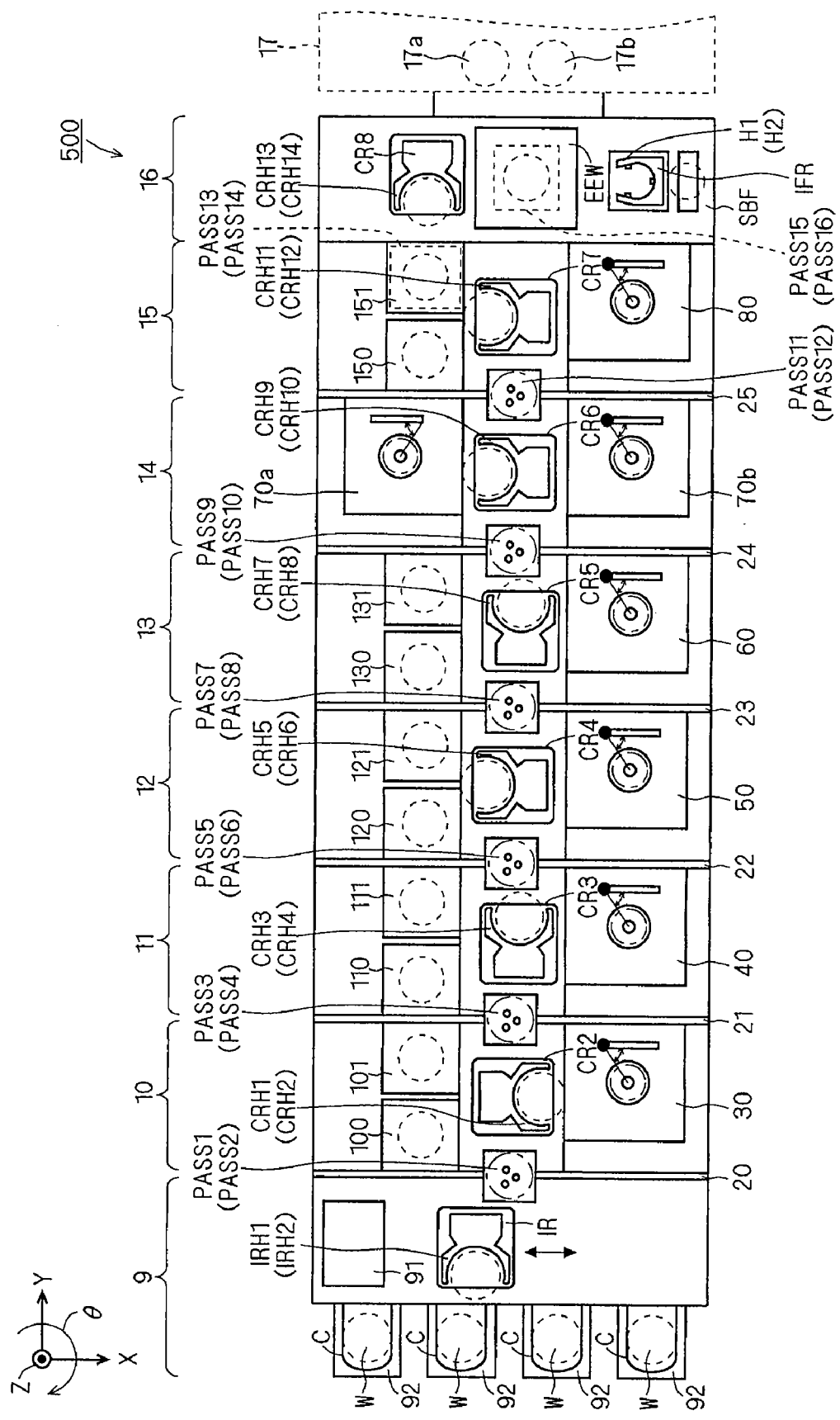
FIG. 1 is a plan view of a substrate processing apparatus.
Figure 3:
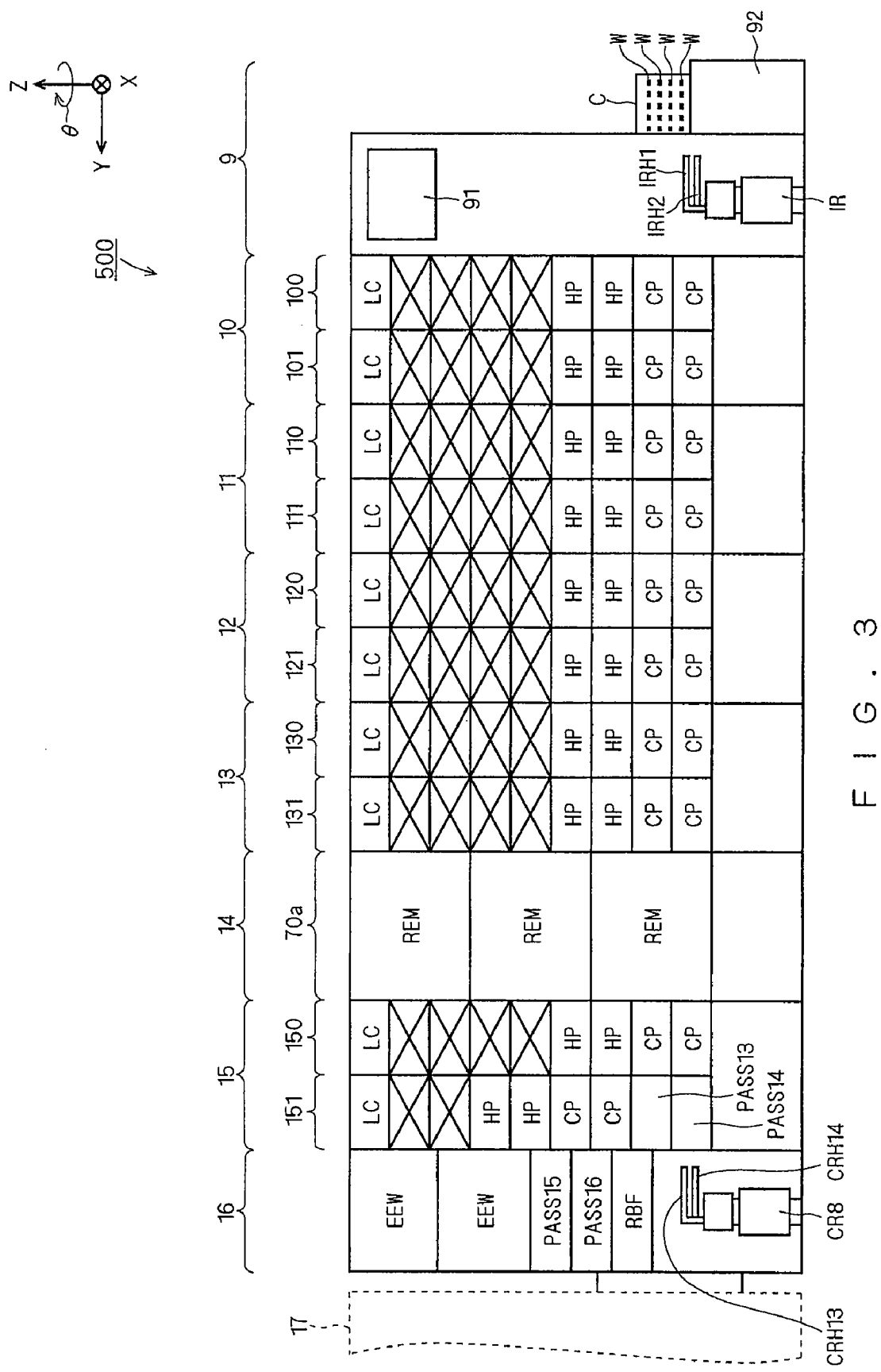
FIG. 3 is a side view of the substrate processing apparatus as viewed from the −X side.

A substrate processing apparatus 500 according to one embodiment of the present invention is discussed below with reference to the drawings. FIGS. 1 to 3 to be referred to in the discussion below are given a common XYZ rectangular coordinate system in order to clearly show positional relationship between parts and the direction of operation of the parts.

First Embodiment

1. Overall Configuration of Substrate Processing Apparatus

FIG. 1 is a plan view showing the overall configuration of a substrate processing apparatus 500 according to a first embodiment of the present invention. The substrate processing apparatus 500 is responsible for a series of process steps including coating, thermal process, development process and the like on a semiconductor substrate W (hereinafter simply referred to as a "substrate W") before and after immersion exposure process. As shown in FIG. 1, the substrate processing apparatus 500 mainly comprises an indexer block 9, an anti-reflection film processing block 10, a resist film processing block 11, a development processing block 12, a resist coating film processing block 13, a resist coating film removal block 14, a cleaning/drying processing block 15 and an interface block 16 arranged in juxtaposition in this order.

An exposure device 17 is connected on the +Y side to the interface block 16. The exposure device 17 is separated from the substrate processing apparatus 500. The exposure device 17 is responsible for immersion exposure process on a substrate W.

The indexer block 9 includes a main controller (control part) 91 responsible for the control of the operation of each block, a plurality of carrier mount tables 92 and an indexer robot IR. The indexer robot IR has two upper and lower hands IRH1 and IRH2 responsible for the transfer of a substrate W.

The anti-reflection film processing block 10 includes thermal processors 100 and 101 for anti-reflection films, a coating processor 30 for anti-reflection films, and a second center robot CR2. The thermal processors 100 and 101 for anti-reflection films, and the coating processor 30 for anti-reflection films are arranged opposite each other with the second center robot CR2 held therebetween. The second center robot CR2 has two upper and lower hands CRH1 and CRH2 responsible for the transfer of a substrate W.

A partition 20 for atmospheric isolation is provided between the indexer block 9 and the anti-reflection film processing block 10. Part of the partition 20 is provided with upper and lower substrate holding parts PASS1 and PASS2 arranged close to each other and which serve to transfer a substrate W between the indexer block 9 and the anti-reflection film processing block 10. The upper substrate holding part PASS1 is used to transfer a substrate W from the indexer block 9 to the anti-reflection film processing block 10. The lower substrate holding part PASS2 is used to transfer a substrate W from the anti-reflection film processing block 10 to the indexer block 9.

The resist film processing block 11 includes thermal processors 110 and 111 for resist films, a coating processor 40 for resist films, and a third center robot CR3. The thermal processors 110 and 111 for resist films, and the coating processor 40 for resist films are arranged opposite each other with the third center robot CR3 held therebetween. The third center robot CR3 has two upper and lower hands CRH3 and CRH4 responsible for the transfer of a substrate W.

A partition 21 for atmospheric isolation is provided between the anti-reflection film processing block 10 and the resist film processing block 11. Part of the partition 21 is provided with upper and lower substrate holding parts PASS3 and PASS4 arranged close to each other and which serve to transfer a substrate W between the anti-reflection film processing block 10 and the resist film processing block 11. The upper substrate holding part PASS3 is used to transfer a substrate W from the anti-reflection film processing block 10 to the resist film processing block 11. The lower substrate holding part PASS4 is used to transfer a substrate W from the resist film processing block 11 to the anti-reflection film processing block 10.

The development processing block 12 includes thermal processors 120 and 121 for development, a development processor 50, and a fourth center robot CR4. The thermal processors 120 and 121 for development, and the development processor 50 are arranged opposite each other with the fourth center robot CR4 held therebetween. The fourth center robot CR4 has two upper and lower hands CRH5 and CRH6 responsible for the transfer of a substrate W.

A partition 22 for atmospheric isolation is provided between the resist film processing block 11 and the development processing block 12. Part of the partition 22 is provided with upper and lower substrate holding parts PASS5 and PASS6 arranged close to each other and which serve to transfer a substrate W between the resist film processing block 11 and the development processing block 12. The upper substrate holding part PASS5 is used to transfer a substrate W from the resist film processing block 11 to the development processing block 12. The lower substrate holding part PASS6 is used to transfer a substrate W from the development processing block 12 to the resist film processing block 11.

The resist coating film processing block 13 includes thermal processors 130 and 131 for resist coating films, a coating processor 60 for resist coating films, and a fifth center robot CR5. The thermal processors 130 and 131 for resist coating films, and the coating processor 60 for resist coating films are arranged opposite each other with the fifth center robot CR5 held therebetween. The fifth center robot CR5 has two upper and lower hands CRH7 and CRH8 responsible for the transfer of a substrate W.

A partition 23 for atmospheric isolation is provided between the development processing block 12 and the resist coating film processing block 13. Part of the partition 23 is provided with upper and lower substrate holding parts PASS7 and PASS8 arranged close to each other and which serve to transfer a substrate W between the development processing block 12 and the resist coating film processing block 13. The upper substrate holding part PASS7 is used to transfer a substrate W from the development processing block 12 to the resist coating film processing block 13. The lower substrate holding part PASS8 is used to transfer a substrate W from the resist coating film processing block 13 to the development processing block 12.

The resist coating film removal block 14 includes processors 70a and 70b for the removal of resist coating films, and a sixth center robot CR6. The processors 70a and 70b for the removal of resist coating films are arranged opposite each other with the sixth center robot CR6 held therebetween. The sixth center robot CR6 has two upper and lower hands CRH9 and CRH10 responsible for the transfer of a substrate W.

A partition 24 for atmospheric isolation is provided between the resist coating film processing block 13 and the resist coating film removal block 14. Part of the partition 24 is provided with upper and lower substrate holding parts PASS9 and PASS10 arranged close to each other and which serve to transfer a substrate W between the resist coating film processing block 13 and the resist coating film removal block 14. The upper substrate holding part PASS9 is used to transfer a substrate W from the resist coating film processing block 13 to the resist coating film removal block 14. The lower substrate holding part PASS10 is used to transfer a substrate W from the resist coating film removal block 14 to the resist coating film processing block 13.

The cleaning/drying processing block 15 includes thermal processors 150 and 151 for post-exposure baking, a cleaning/drying processor 80, and a seventh center robot CR7. The thermal processor 151 for post-exposure baking is arranged adjacent to the interface block 16, and is provided with substrate holding parts PASS13 and PASS14 as discussed later. The thermal processors 150 and 151 for post-exposure baking, and the cleaning/drying processor 80 are arranged opposite each other with the seventh center robot CR7 held therebetween. The seventh center robot CR7 has two upper and lower hands CRH11 and CRH12 responsible for the transfer of a substrate W.

A partition 25 for atmospheric isolation is provided between the resist coating film removal block 14 and the cleaning/drying processing block 15. Part of the partition 25 is provided with upper and lower substrate holding parts PASS11 and PASS12 arranged close to each other and which serve to transfer a substrate W between the resist coating film removal block 14 and the cleaning/drying processing block 15. The upper substrate holding part PASS11 is used to transfer a substrate W from the resist coating film removal block 14 to the cleaning/drying processing block 15. The lower substrate holding part PASS12 is used to transfer a substrate W from the cleaning/drying processing block 15 to the resist coating film removal block 14.

The interface block 16 includes an eighth center robot CR8, a feed buffer SBF, an interface-specific transport mechanism IFR, and edge exposure units EEW. Substrate holding parts PASS15 and PASS16, and a return buffer RBF discussed later are arranged below the edge exposure units EEW. The eighth center robot CR8 has two upper and lower hands CRH13 and CRH14 responsible for the transfer of a substrate W. The interface-specific transport mechanism IFR has two upper and lower hands H1 and H2 responsible for the transfer of a substrate W.

FIG. 2 is a side view of the substrate processing apparatus 500 as viewed from the +X side.

The coating processor 30 for anti-reflection films arranged in the anti-reflection film processing block 10 (see FIG. 1) includes three vertically stacked coating units BARC. Each coating unit BARC has a spin chuck 31 for rotating a substrate W while holding the substrate W under suction in a horizontal position, a supply nozzle 32 for supplying a coating solution for forming an anti-reflection film onto a substrate W held on the spin chuck 31, and a removal nozzle not shown (that is a so-called EBR (edge bead remover)) for removing an anti-reflection film defined in the periphery of a substrate W.

The coating processor 40 for resist films arranged in the resist film processing block 11 (see FIG. 1) includes three vertically stacked coating units RES. Each coating unit RES has a spin chuck 41 for rotating a substrate W while holding the substrate W under suction in a horizontal position, a supply nozzle 42 for supplying a coating solution for forming a resist film onto a substrate W held on the spin chuck 31, and a removal nozzle (not shown) for removing a resist film defined in the periphery of a substrate W.

The development processor 50 arranged in the development processing block 12 (see FIG. 1) includes five vertically stacked development processing units DEV. Each development processing unit DEV has a spin chuck 51 for rotating a substrate W while holding the substrate W under suction in a horizontal position, and a supply nozzle 52 for supplying a developing solution onto a substrate W held on the spin chuck 51.

The coating processor 60 for resist coating films arranged in the resist coating film processing block 13 (see FIG. 1) includes three vertically stacked coating units COV. Each coating unit COV has a spin chuck 61 for rotating a substrate W while holding the substrate W under suction in a horizontal position, a supply nozzle 62 for supplying a coating solution for forming a resist coating film onto a substrate W held on the spin chuck 61, and a removal nozzle (not shown) for removing a resist coating film defined in the periphery of a substrate W.

The processor 70b for the removal of resist coating films arranged in the resist coating film removal block 14 (see FIG. 1) includes three vertically stacked removal units REM. Each removal unit REM has a spin chuck 71 for rotating a substrate W while holding the substrate W under suction in a horizontal position, and a supply nozzle 72 for supplying a remover (such as fluororesin) for liquefying a resist coating film onto a substrate W held on the spin chuck 71.

The cleaning/drying processor 80 arranged in the cleaning/drying processing block 15 (see FIG. 1) includes three vertically stacked cleaning/drying processing units SD.

The interface block 16 includes a vertical stack of the two edge exposure units EEW, the substrate holding parts PASS15 and PASS16, and the return buffer RBF. The interface block 16 also includes the eighth center robot CR8 (see FIG. 1) and the interface-specific transport mechanism IFR. Each edge exposure unit EEW has a spin chuck 98 for rotating a substrate W while holding the substrate W under suction in a horizontal position, and a light emitter 99 for exposing the periphery of a substrate W to light held on the spin chuck 98.

FIG. 3 is a side view of the substrate processing apparatus 500 as viewed from the −X side.

The thermal processors 100 and 101 for anti-reflection films arranged in the anti-reflection film processing block 10 each include a vertical stack of two heating units (hot plates) HP and two cooling units (cooling plates) CP. A local controller LC for controlling the temperatures of the cooling units CP and the heating units HP is provided in the uppermost section of each of the thermal processors 100 and 101 for anti-reflection films. The structure of each of the units HP and CP arranged in the thermal processors 100 and 101 for anti-reflection films is discussed in more detail later with reference to FIG. 6 and so on.

The thermal processors 110 and 111 for resist films arranged in the resist film processing block 11 each include a vertical stack of two heating units HP and two cooling units CP. A local controller LC for controlling the temperatures of the cooling units CP and the heating units HP is provided in the uppermost section of each of the thermal processors 110 and 111 for resist films.

The thermal processors 120 and 121 for development arranged in the development processing block 12 each include a vertical stack of two heating units HP and two cooling units CP. A local controller LC for controlling the temperatures of the cooling units CP and the heating units HP is provided in the uppermost section of each of the thermal processors 120 and 121 for development.

The thermal processors 130 and 131 for resist coating films arranged in the resist coating film processing block 13 each include a vertical stack of two heating units HP and two cooling units CP. A local controller LC for controlling the temperatures of the cooling units CP and the heating units HP is provided in the uppermost section of each of the thermal processors 130 and 131 for resist coating films.

The processor 70a for the removal of resist coating films arranged in the resist coating film removal block 14 includes a vertical stack of three removal units REM.

The thermal processors 150 and 151 for post-exposure baking arranged in the cleaning/drying processing block 15 each include a vertical stack of two heating units HP and two cooling units CP. The thermal processor 151 for post-exposure baking also includes the substrate holding parts PASS13 and PASS14. A local controller LC for controlling the temperatures of the cooling units CP and the heating units HP is provided in the uppermost section of each of the thermal processors 150 and 151 for post-exposure baking.

The numbers of the coating units BARC, RES and COV, and the numbers of the cleaning/drying processing units SD, removal units REM, development processing units DEV, heating units HP and cooling units CP may be suitably changed in response to the processing speed of each block.

2. Overall Operation of Substrate Processing Apparatus

Figure 4:
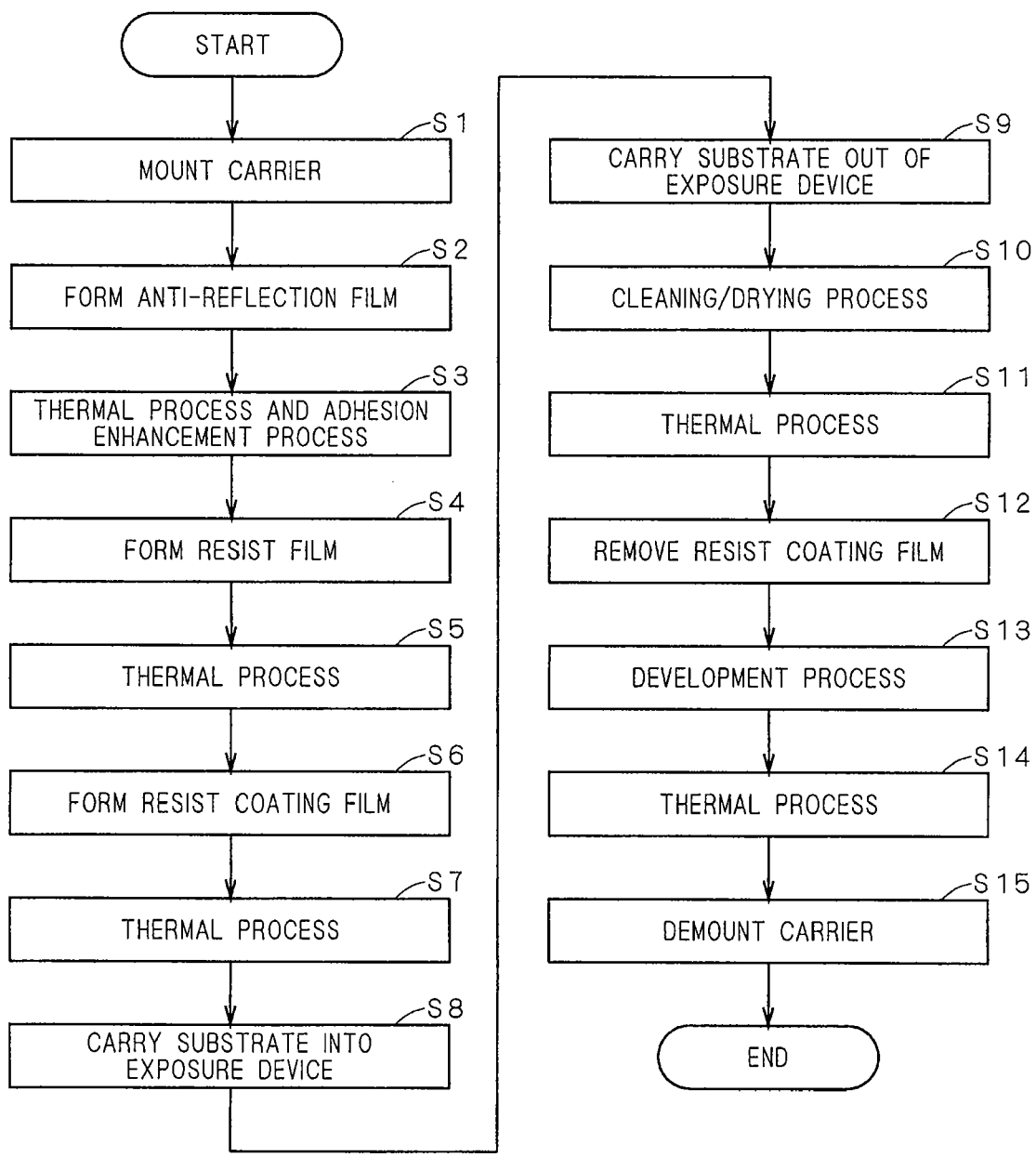
FIG. 4 is a flow diagram showing the flow of the overall operation of the substrate processing apparatus.

Next, the overall operation of the substrate processing apparatus 500 is discussed in outline with reference to FIGS. 1 to 3 and the flow diagram shown in FIG. 4. In order to process a substrate W in the substrate processing apparatus 500, a carrier C that stores a plurality of substrates W in tiers is placed onto the carrier mount table 92 of the indexer block 9 (step S1).

When the carrier C is placed on the carrier mount table 92, the indexer robot IR takes an unprocessed substrate W out of the carrier C by using the upper hand IRH1. Then, the indexer robot IR rotates in the θ direction while traveling in the X axis direction to transfer the unprocessed substrate W onto the substrate holding part PASS1.

The second center robot CR2 of the anti-reflection film processing block 10 picks up the substrate W placed on the substrate holding part PASS1, and transports the same to the coating unit BARC of the coating processor 30 for anti-reflection films. In the coating unit BARC, an anti-reflection film for reducing standing waves or halation occurring during exposure process is formed on the upper surface of the substrate W (step S2). The anti-reflection film defined in an area with certain dimensions extending from the periphery of the substrate W is removed by a remover supplied from the removal nozzle in the coating unit BARC.

Thereafter the second center robot CR2 takes the substrate W out of the coating processor 30 for anti-reflection films, and carries the same into the thermal processor 100 or 101 for anti-reflection films. In the thermal processor 100 or 101 for anti-reflection films, certain thermal process (including heating process and cooling process) and adhesion enhancement process are concurrently performed on the substrate W (step S3) that are discussed in detail later. After the completion of the thermal process and the adhesion enhancement process at the thermal processor 100 or 101 for anti-reflection films, the second center robot CR2 takes the substrate W out of the thermal processor 100 or 101 for anti-reflection films, and transfers the same onto the substrate holding part PASS3.

The third center robot CR3 of the resist film processing block 11 picks up the substrate W placed on the substrate holding part PASS3, and transports the same to the coating unit RES of the coating processor 40 for resist films. In the coating unit RES, a resist film is formed over the anti-reflection film that is provided in the upper surface of the substrate W (step S4). The resist film defined in an area with certain dimensions extending from the periphery of the substrate W is removed by a remover supplied from the removal nozzle in the coating processor RES.

Thereafter the third center robot CR3 takes the substrate W out of the coating processor 40 for resist films, and carries the same into the thermal processor 110 or 111 for resist films. In the thermal processor 110 or 111 for resist films, a thermal process (including heating process and cooling process) is performed on the substrate W (step S5). After the completion of the thermal process at the thermal processor 110 or 111 for resist films, the third center robot CR3 takes the substrate W out of the thermal processor 110 or 111 for resist films, and transfers the same onto the substrate holding part PASS5.

The fourth center robot CR4 of the development processing block 12 picks up the substrate W placed on the substrate holding part PASS5, and transfers the same onto the substrate holding part PASS7.

The fifth center robot CR5 of the resist coating film processing block 13 picks up the substrate W placed on the substrate holding part PASS7, and transports the same to the coating unit COV of the coating processor 60 for resist coating films. In the coating unit COV, a resist coating film is formed over the resist film that is provided in the upper surface of the substrate W (step S6). The resist coating film defined in an area with certain dimensions extending from the periphery of the substrate W is removed by a remover supplied from the removal nozzle in the coating processor COV.

Thereafter the fifth center robot CR5 takes the substrate W out of the coating processor 60 for resist coating films, and carries the same into the thermal processor 130 or 131 for resist coating films. In the thermal processor 130 or 131 for resist coating films, a thermal process (including heating process and cooling process) is performed on the substrate W (step S7). After the completion of the thermal process at the thermal processor 130 or 131 for resist coating films, the fifth center robot CR5 takes the substrate W out of the thermal processor 130 or 131 for resist coating films, and transfers the same onto the substrate holding part PASS9.

Figure 5A:
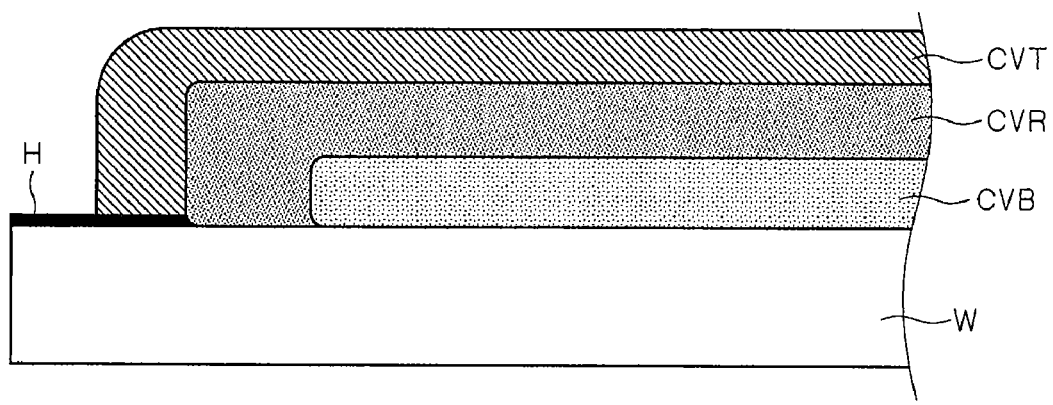
FIGS. 5A and 5B are vertical sectional views each showing the structure of a stack of an anti-reflection film, a resist film and a resist coating film.
Figure 5B:
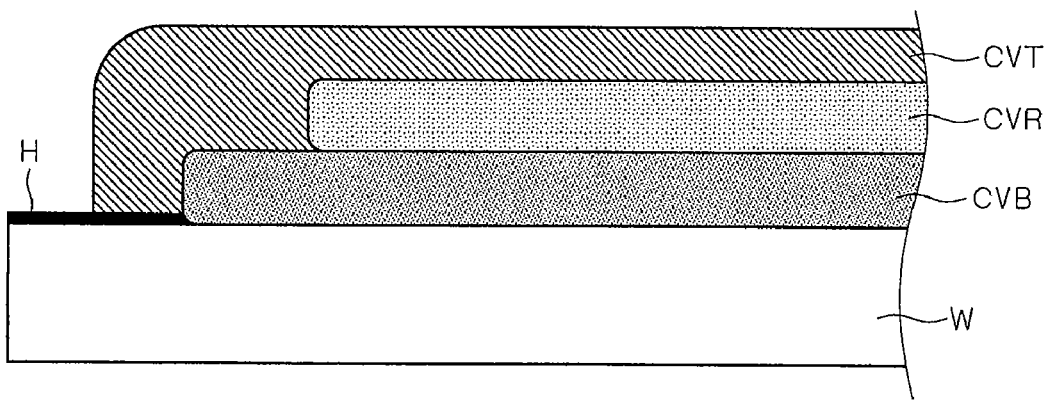

FIGS. 5A and 5B are vertical sectional views each showing an exemplary structure of a stack of an anti-reflection film CVB, a resist film CVR and a resist coating film CVT deposited in the upper surface of a substrate W. With reference to each one of FIGS. 5A and 5B, the anti-reflection film CVB, the resist film CVR and the resist coating film CVT are stacked in this order from bottom to top in the upper surface of the substrate W. Peripheral portions of these coating films are removed by the removers to define respective end positions of the coating films.

As shown in FIGS. 5A and 5B, the end position of the resist coating film CVT is defined on the outer side of the end position of the resist film CVR. This allows the upper portion of the resist film CVR to be completely covered by the resist coating film CVT, thereby protecting the resist film CVR from a solution for immersion exposure during exposure process at the exposure device 17.

The end position of the resist coating film CVT may be either on the inner side or on the outer side of the end position of the anti-reflection film CVB. The adhesion between the resist coating film CVT and the anti-reflection film CVB is relatively strong. Thus, when the end position of the resist coating film CVT is on the inner side of the end position of the anti-reflection film CVB, the resist coating film CVT is unlikely to peel off. Meanwhile, the adhesion between the resist coating film CVT and the substrate surface is relatively weak. In the present embodiment, in adhesion enhancement process discussed in detail later, an adhesion enhancing agent H is applied at least to an area on the outer side of the end position of the anti-reflection film CVB. This enhances the adhesion between the resist coating film CVT and the substrate surface in the area on the outer side of the end position of the anti-reflection film CVB. Thus the resist coating film CVT is unlikely to peel off even when the end position of the resist coating film CVT is on the outer side of the end position of the anti-reflection film CVB.

The end position of the resist film CVR may be either on the outer side of the end position of the anti-reflection film CVB as shown in FIG. 5A, or on the inner side of the end position of the anti-reflection film CVB as shown in FIG. 5B.

Turning back to FIGS. 1 to 4 for the operation of the substrate processing apparatus 500, the sixth center robot CR6 of the resist coating film removal block 14 picks up the substrate W placed on the substrate holding part PASS9, and transfers the same onto the substrate holding part PASS11. The seventh center robot CR7 of the cleaning/drying processing block 15 picks up the substrate W placed on the substrate holding part PASS11, and transfers the same onto the substrate holding part PASS13. The eighth center block CR8 of the interface block 16 picks up the substrate W placed on the substrate holding part PASS13, and transfers the same onto the substrate holding part PASS15. In the interface block 16, a substrate W may be transported to the edge exposure unit EEW to be subjected to exposure process at its periphery.

The interface-specific transport mechanism IFR of the interface block 16 carries the substrate W placed on the substrate holding part PASS15 into a substrate receiving unit 17a of the exposure device 17 (step S8). When the exposure device 17 fails to accept the substrate W, the substrate W is temporarily stored in the feed buffer SBF. In the exposure device 17, the substrate W is subjected to immersion exposure process to form an electronic pattern in the upper surface of the substrate W.

Thereafter the interface-specific transport mechanism IFR of the interface block 16 takes the substrate W after being subjected to exposure process out of a substrate sending part 17b (step S9), and carries the same into the cleaning/drying processor 80 of the cleaning/drying processing block 15. When the cleaning/drying processor 80 fails to accept the substrate W, the substrate W is temporarily stored in the return buffer RBF. In the cleaning/drying processing unit SD of the cleaning/drying processor 80, cleaning and drying processes are performed on the substrate W after being subjected to exposure process (step S10).

When the cleaning and drying processes at the cleaning/drying processor 80 are completed, the interface-specific transport mechanism IFR of the interface block 16 takes the substrate W out of the cleaning/drying processor 80, and transfers the same onto the substrate holding part PASS16.

The eighth center robot CR8 of the interface block 16 picks up the substrate W placed on the substrate holding part PASS16, and transports the same to the thermal processor 150 or 151 for post-exposure baking. In the thermal processor 150 or 151 for post-exposure baking, a thermal process (including heating process and cooling process) is performed on the substrate W after being subjected to exposure process (step S11). After the completion of the thermal process at the thermal processor 150 or 151 for post-exposure baking, the eighth center robot CR8 of the interface block 16 takes the substrate W out of the thermal processor 150 or 151 for post-exposure baking, and transfers the same onto the substrate holding part PASS14. The seventh center robot CR7 of the cleaning/drying processing block 15 picks up the substrate W placed on the substrate holding part PASS14, and transfers the same onto the substrate holding part PASS12.

The sixth center robot CR6 of the resist coating film removal block 14 picks up the substrate W placed on the substrate holding part PASS12, and carries the same into the removal unit REM of the processor 70a or 70b for the removal of resist coating films. In the removal unit REM, the resist coating film is removed by using a certain remover from the upper surface of the substrate W (step S12).

Thereafter the sixth center robot CR6 takes the substrate W out of the processor 70a or 70b for the removal of resist coating films, and transfers the same onto the substrate holding part PASS10. The fifth center robot CR5 of the resist coating film processing block 13 picks up the substrate W placed on the substrate holding part PASS10, and transfers the same onto the substrate holding part PASS8.

The fourth center robot CR4 of the development processing block 12 picks up the substrate W placed on the substrate holding part PASS8, and carries the same into the development processing unit DEV of the development processor 50. In the development processing unit DEV, a developing solution is supplied onto the upper surface of the substrate W to thereby realize development process (step S13).

Thereafter the fourth center robot CR4 takes the substrate W out of the development processor 50, and carries the same into the thermal processor 120 or 121 for development. In the thermal processor 120 or 121 for development, a thermal process (including heating process and cooling process) is performed on the substrate W (step S14). After the completion of the thermal process at the thermal processor 120 or 121 for development, the fourth center robot CR4 takes the substrate W out of the thermal processor 120 or 121 for development, and transfers the same onto the substrate holding part PASS6.

The third center robot CR3 of the resist film processing block 11 picks up the substrate W placed on the substrate holding part PASS6, and transfers the same onto the substrate holding part PASS4. The second center robot CR2 of the anti-reflection film processing block 10 picks up the substrate W placed on the substrate holding part PASS4, and transfers the same onto the substrate holding part PASS2. Further, the indexer robot IR of the indexer block 9 picks up the substrate W placed on the substrate holding part PASS2, and puts the same into the carrier C on the carrier mount table 92. Thereafter the carrier C is carried out of the carrier mount table 92 (step S15), so the series of process steps for the substrate processing is completed in the substrate processing apparatus 500.

Figure 6:
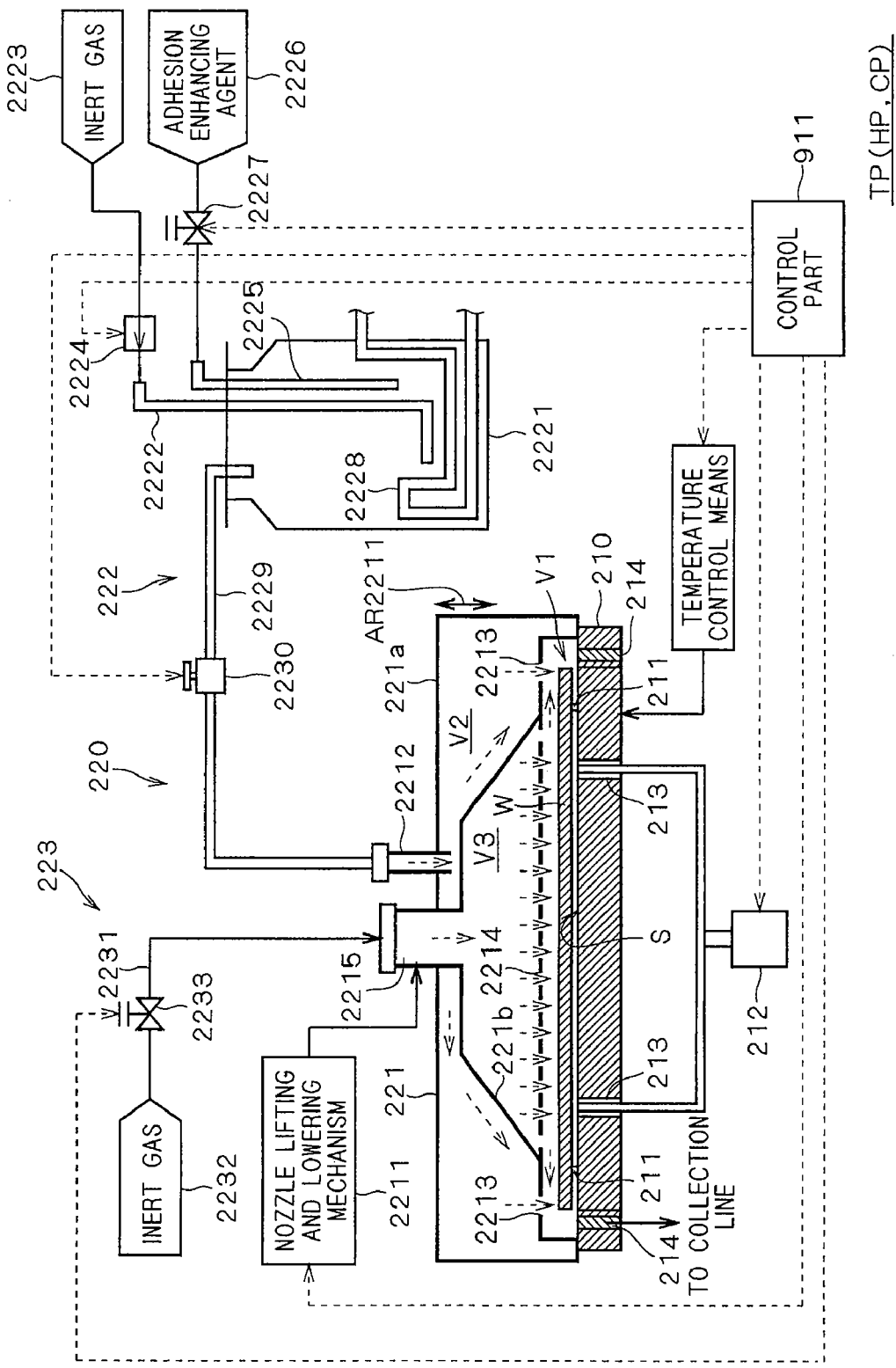
FIG. 6 shows the structure of a thermal processing unit provided in a thermal processor for anti-reflection films.

3. Adhesion Enhancement Process 3-1. Configuration Related to Adhesion Enhancement Process The heating units HP and the cooling units CP (which may be collectively referred to as "thermal processing units TP" when distinction therebetween is not necessary) provided in the thermal processors 100 and 101 for anti-reflection films are discussed with reference to FIG. 6. FIG. 6 shows the structure of the thermal processing unit TP. In the discussion presented below, reference is made to FIG. 7 where appropriate which is a side sectional view of a thermal processing plate 210 and a covering nozzle 221.

The thermal processing unit TP mainly includes the substantially disk shaped thermal processing plate 210 for performing thermal process on a substrate W placed over the upper surface of the thermal processing plate 210 in a horizontal position, and an adhesion enhancing agent supply part 220 for supplying an adhesion enhancing agent onto a substrate W placed over the thermal processing plate 210. The thermal processing unit TP further includes a unit controller (control part) 911 responsible for the control of each part in the unit. The functional parts 210 and 220 are stored in a chamber not shown (which is for example a casing formed from a metallic substance such as stainless steel).

i. Thermal Processing Plate 210

Ceramic balls 211 that are for example three in number are buried in the upper surface of the thermal processing plate 210. A substrate W to be processed is placed over the thermal processing plate 210 with a certain gap (0.1 mm, for example) therebetween that is defined by the ceramic balls 211. An air cylinder 212 is provided below the thermal processing plate 210. The air cylinder 210 causes a plurality of support pins 213 (three, for example) to simultaneously move up and down. A tip portion of each of the support pins 213 passes through a through hole vertically defined in the thermal processing plate 210. When the support pins 213 are caused to move up by the air cylinder 212, the tip portions of the support pins 213 stick out above the thermal processing plate 210. When the support pins 213 are caused to move down by the air cylinder 212, the tip portions of the support pins 213 return to positions lower than the upper surface of the thermal processing plate 210. The air cylinder 212 is electrically connected to the control part 911. The control part 911 controls the actuation of the air cylinder 212 to make switching between a state in which the support pins 213 move up to lift a substrate W from the thermal processing plate 210, and a state in which the support pins 213 move down to place a substrate W onto the thermal processing plate 210.

The thermal processing plate 210 is provided therein with a heater controlled by the local controller LC (see FIG. 3).

The heater controls the temperature of a temperature-controlled region S in the thermal processing plate 210 at a certain temperature. The local controller LC is electrically connected to the control part 911. The control part 911 controls the temperature of the heater by way of the local controller LC thereby heating or cooling a substrate W to the certain temperature that is placed within the temperature-controlled region S over the thermal processing plate 210.

A discharge hole 214 is provided in the periphery of the thermal processing plate 210 and outside the temperature-controlled region S. The discharge hole 214 is connected through a collection line to a drain tank not shown. The discharge hole 214 is decompressed by decompression means not shown. This decompression means is electrically connected to the control part 911. The control part 911 controls the decompression means so that a residual adhesion enhancing agent supplied to a substrate W (adhesion enhancing agent spilling out of the upper surface of the substrate W) can be guided through the discharge hole 214 to the drain tank.

ii. Adhesion Enhancing Agent Supply Part 220

The adhesion enhancing agent supply part 220 mainly includes the covering nozzle 221, a vaporization processor 222, and an inert gas supply part 223.

Covering Nozzle 221

Figure 7:
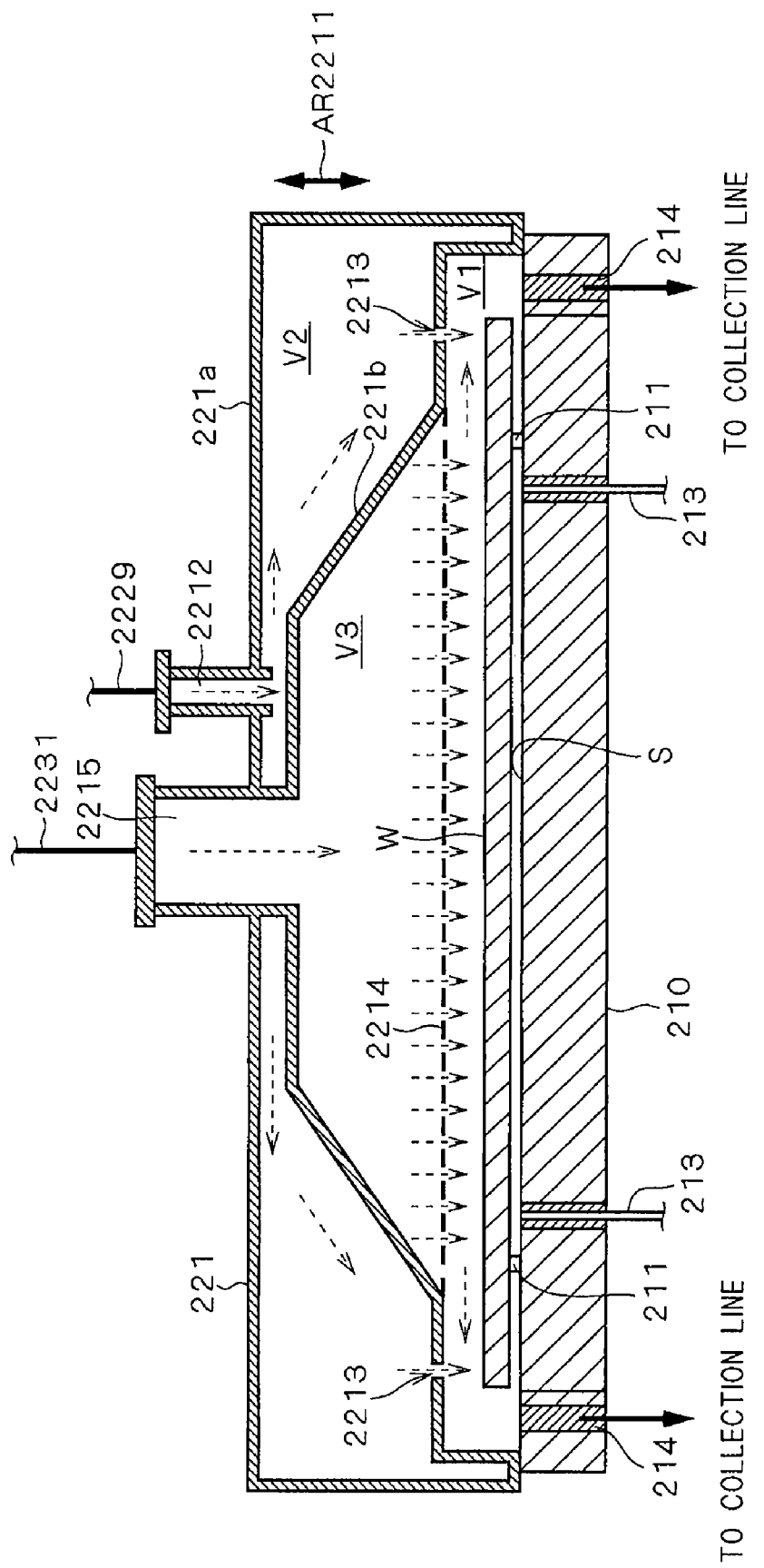
FIG. 7 is a side sectional view of a thermal processing plate and a covering nozzle.

The covering nozzle 221 is intended to cover a substrate W placed over the thermal processing plate 210, and has a substantially circular shape in plan view. A nozzle lifting and lowering mechanism 2211 is connected to the covering nozzle 221. The nozzle lifting and lowering mechanism 2211 is electrically connected to the control part 911. The control part 911 controls the actuation of the nozzle lifting and lowering mechanism 2211 to move the covering nozzle 221 between a processing position (a position defining a closed space between the thermal processing plate 210 and the covering nozzle 221 (closed space V1) as shown in FIGS. 6 and 7), and a retreated position above the processing position (as indicated by an arrow AR2211). When the second center robot CR2 (see FIG. 1) carries a substrate W into and out of the thermal processing plate 210, the control part 911 moves the covering nozzle 221 up from the processing position to the retreated position. After a substrate W is placed onto the thermal processing plate 210, the control part 911 moves the covering nozzle 221 down from the retreated position to the processing position.

The structure of the covering nozzle 221 is discussed in more detail with reference to FIG. 7. The covering nozzle 221 has a cover portion 221a for covering a substrate W supported by the thermal processing plate 210, and a partition wall 221b for partitioning space inside the cover portion 221a. The partition wall 221b is suspended by a supporting column and the like not shown inside the cover portion 221a. Space V2 defined inside the cover portion 221a and outside the partition wall 221b forms a feed path for an adhesion enhancing agent. Space V3 defined inside the partition wall 221b forms a feed path for an inert gas.

Now, the feed path for an adhesion enhancing agent is discussed. An adhesion enhancing agent receiving hole 2212 is defined in the cover portion 221a in such a way as to penetrate the cover portion 221a. A pipe 2229 for taking an adhesion enhancing agent in from the vaporization processor 222 discussed later is connected to the adhesion enhancing agent receiving hole 2212.

The partition wall 221b is a member having a substantially circular shape in plan view, and covers a substrate W placed over the thermal processing plate 210 in an area inside the periphery of the substrate W (inside portion). Then, a gap defined between the cover portion 221a and the partition wall 221b forms a substantially ring shaped discharge slot 2213 extending along the periphery of a substrate W placed over the thermal processing plate 210. The relative positions of the cover portion 221a and the partition wall 221b are adjusted so that the discharge slot 2213 is opposite the periphery of a substrate W placed over the thermal processing plate 210.

In the above-discussed structure, an adhesion enhancing agent guided along the pipe 2229 (which is more particularly an adhesion enhancing agent vaporized at the vaporization processor 222) passes through the adhesion enhancing agent receiving hole 2212 to enter the space V2 defined inside the cover portion 221a and outside the partition wall 221b, thereafter being discharged through the discharge slot 2213. That is, the space V2 defines the feed path for an adhesion enhancing agent. This allows an adhesion enhancing agent to be supplied only onto the periphery of a substrate W placed over the thermal processing plate 210.

A "periphery" to which an adhesion enhancing agent is supplied includes an area near the outer edge of a substrate to be processed and in which a substrate surface is exposed (exposed area) at the time of supply of an adhesion enhancing agent. That is, in the first embodiment, a region including an area on the outer side of the end position of the anti-reflection film CVB (see FIGS. 5A and 5B) corresponds to the "periphery" to which an adhesion enhancing agent is supplied. This "periphery" desirably covers a minimum possible area including the exposed area, and desirably does not include an effective area (patterned area).

The feed path for an inert gas is discussed next. The partition wall 221b is formed into a dome (convex) in side view. A baffle disk 2214 is provided to close the convex, thereby defining the dwelling space V3 inside the partition wall 221b and bounded by the baffle disk 2214. The baffle disk 2214 has a substantially disk shape smaller in radius than the ring of the discharge slot 2213. The baffle disk 2214 has a plurality of small holes defined in its entire surface, and is arranged substantially concentrically with the partition wall 221b. Hence, the baffle disk 2214 is substantially concentric with a substrate W placed over the thermal processing plate 210 when the covering nozzle 221 is disposed at the processing position.

A gas receiving hole 2215 for guiding an inert gas into the dwelling space V3 is defined in the partition wall 221b. A pipe 2231 for taking an inert gas in from the inert gas supply part 223 discussed later is connected to the gas receiving hole 2215.

In the above-discussed structure, an inert gas guided along the pipe 2231 passes through the gas receiving hole 2215 to enter the dwelling space V3 defined inside the partition wall 221b and bounded by the baffle disk 2214, thereafter being discharged through the small holes defined in the baffle disk 2214. This allows an inert gas to be supplied to the inside portion of a substrate W placed over the thermal processing plate 210. The inert gas discharged through the small holes flows from the inside portion toward the periphery of the substrate W, and is thereafter emitted through the discharge hole 214. The formation of the flow of the inert gas toward the periphery of the substrate W allows the substrate W to be placed in an atmosphere of the inert gas, while preventing the entry of an adhesion enhancing agent discharged through the discharge slot 2213 into the inside portion of the substrate W.

Vaporization Processor 222

Turning back to FIG. 6, the vaporization processor 222 is discussed next. The vaporization processor 222 includes a solution container 2221 for storing an adhesion enhancing agent. The solution container 2221 is connected via an inert gas supply pipe 2222 with a regulator 2224 interposed therein to an inert gas supply source 2223. The regulator 2224 is electrically connected to the control part 911. The control part 911 controls the regulator 2224 to supply an inert gas under certain pressure from the inert gas supply source 2223 to the solution container 2221. As an example, nitrogen (N2) gas or argon (Ar) gas may be used as an inert gas.

The solution container 2221 is also connected via an adhesion enhancing agent supply pipe 2225 with a valve 2227 interposed therein to an adhesion enhancing agent supply source 2226. The valve 2227 is electrically connected to the control part 911. The control part 911 controls the opening and closing of the valve 2227 to supply an adhesion enhancing agent from the adhesion enhancing agent supply source 2226 to the solution container 2221. As an example, HMDS (hexamethyldisilazane) may be used as an adhesion enhancing agent.

The solution container 2221 is provided with a heat exchange coil 2228 attached to its lower portion. A current is supplied from a current supply source not shown to the heat exchange coil 2228 to raise the temperature of the heat exchange coil 2228. This realizes vaporization of an adhesion enhancing agent stored in the solution container 2221.

The solution container 2221 is also connected through the pipe 2229 with a valve 2230 interposed therein to the covering nozzle 221. The valve 2230 is electrically connected to the control part 911. The control part 911 controls the opening and closing of the valve 2230 to thereby guide an adhesion enhancing agent vaporized in the solution container 2221 to the space V2 inside the covering nozzle 221. The control of the valve 2230 leads to the control of the flow rate of an adhesion enhancing agent supplied to the internal space V2 (namely, the flow rate of an adhesion enhancing agent discharged through the discharge slot 2213).

Inert Gas Supply Part 223

The inert gas supply part 223 includes the pipe 2231 having one end connected to the gas receiving hole 2215 defined in the covering nozzle 221, and the other end connected to an inert gas supply source 2232. The pipe 2231 is provided with a valve 2233 that is electrically connected to the control part 911. The control part 911 controls the opening and closing of the valve 2233 to supply an inert gas from the inert gas supply source 2232 to the dwelling space V3. As an example, nitrogen (N2) gas or argon (Ar) gas may be used as an inert gas.

3-2. Operation at Thermal Processing Unit TP

Next, the operation executed at the thermal processing unit TP (process at step S3 in FIG. 4) is discussed.

First, the second center robot CR2 (see FIG. 1) carries a substrate W into a predetermined one of the four thermal processing units TP arranged in each of the thermal processors 100 and 101 for anti-reflection films, and transfers the substrate W onto the thermal processing plate 210 in this thermal processing unit.

Next, the controller 911 performs a thermal process on the substrate W placed over the thermal processing plate 210. More specifically, the heater internal to the thermal processing plate 210 is controlled to set the temperature-controlled region S at a certain temperature so that the substrate W placed over the thermal processing plate 210 is heated up or cooled down to the certain temperature. In parallel with this thermal process, control part 911 performs a process (adhesion enhancement process) to supply an adhesion enhancing agent to the periphery of the substrate W placed over the thermal processing plate 210. The adhesion enhancement process is discussed in more detail below.

First, the control part 911 controls the actuation of the nozzle lifting and lowering mechanism 2211 to place the covering nozzle 221 at the processing position. Then the control part 911 opens the valve 2233 of the inert gas supply part 223 to guide an inert gas through the gas receiving hole 2215 into the dwelling space V3. The inert gas entering the dwelling space V3 is discharged through the small holes defined in the baffle disk 2214 to the surface of the substrate W. This causes the surface of the substrate W to be placed in an atmosphere of the inert gas, while forming a flow of the inert gas toward the periphery of the substrate W.

At the same time, the control part 911 controls the regulator 2224 and the valve 2227 of the vaporization processor 222 to collect an inert gas and an adhesion enhancing agent in the solution container 2221. The control part 911 also raises the temperature of the heat exchange coil 2228 to vaporize the adhesion enhancing agent stored in the solution container 2221. Further, the valve 2230 interposed in the pipe 2229 for connecting the solution container 2221 an the adhesion enhancing agent receiving hole 2212 is opened so that the adhesion enhancing agent vaporized in the solution container 2221 is guided through the adhesion enhancing agent receiving hole 2212 into the internal space V2. The adhesion enhancing agent guided into the internal space V2 is discharged through the discharge slot 2213. Namely, the adhesion enhancing agent is supplied onto the periphery of the substrate W placed over the thermal processing plate 210. When the adhesion enhancing agent in some quantity is supplied to the substrate W, the control part 911 closes the valve 2230 to stop the supply of the adhesion enhancing agent.

The discharge hole 214 is subjected to a negative pressure applied by the control part 911 during the supply of an adhesion enhancing agent. Thus, a residual adhesion enhancing agent is guided through the discharge hole 214, thereafter passing through the collection line to be collected in the drain tank (not shown). The flow of the adhesion enhancement process is as given above.

After the completion of the thermal process and adhesion enhancement processing, the substrate W is carried out of the thermal processing unit TP by the second center robot CR2. Then the series of process steps on one substrate W in the thermal processing unit TP is completed.

4. Effect

In the substrate processing apparatus 500 according to the above-discussed first embodiment, an adhesion enhancing agent is supplied to a substrate W over which a resist coating film is yet to be formed. This enhances the adhesion between the substrate W at the periphery and the resist coating film, thereby preventing film exfoliation in the vicinity of an edge of the substrate W.

An adhesion enhancing agent is selectively supplied only onto the periphery of a substrate W. This controls the number of defects generated to a low level after development processing as compared to the case where an adhesion enhancing agent is applied to a substrate surface in its entirety including an inside portion with respect to the periphery. The reason therefor is given below.

A resist coating film is removed after exposure process. Hence, an area in which an adhesion enhancing agent is applied makes an appearance in a surface of a substrate W. The area coated with an adhesion enhancing agent is placed in a hydrophobic state (a state with a high degree of water repellency). When an adhesion enhancing agent is applied to the entire surface of a substrate W, an area in which the adhesion enhancing agent was applied extends entirely over the substrate surface (namely, the entire area including a patterned area) after the resist coating film is removed. That is, the entire substrate surface has a high degree of water repellency. The area with a high degree of water repellency easily attracts particles. When the substrate W in this condition is subjected to development process, a resist and the like once removed from the substrate surface by the development process is quite likely be drawn to the substrate W to be deposited again on the surface of the substrate W. The deposited particles may cause development failure. As a result of the presence of the area with a high degree of water repellency that extends entirely over the substrate surface, a residual rinsing solution may nonuniformly remain, as is known. This is also a cause of development failure.

In contrast, when an adhesion enhancing agent is selectively supplied only onto the periphery of a substrate W as in the first embodiment, the coverage of an area in which an adhesion enhancing agent applied thereto is exposed (namely, an area with a high degree of water repellency) is limited to the periphery of the substrate W. Thus, as compared to the above-discussed case, particles are less likely to be drawn to the substrate W, so no nonuniform remaining of solution is left in a pattern area. As a result, development failure is unlikely to occur. Thus, according to the structure for selectively supplying an adhesion enhancing agent only onto the periphery of a substrate W, the number of defects generated after development process can be controlled to a low level.

Further, the adhesion enhancement process is performed in parallel with thermal process (PAB (post apply bake) process) on a substrate W to which a coating solution for forming an anti-reflection film has been applied. This prevents film exfoliation in the vicinity of an edge of the substrate W without exerting any influence on throughput.

In the first embodiment discussed above, the adhesion enhancement process precedes the formation of a resist film. In this case, the adhesion enhancing agent H is supplied to an edge-cut area of the anti-reflection film CVB (a surface of a substrate W caused to be exposed by the removal of the film in the periphery). This enhances the adhesion not only between the resist coating film CVT and the substrate surface but also between the resist film CVR and the substrate surface, thereby preventing the exfoliation not only of the resist coating film CVT but also of the resist film CVR. As a result, the generation of development failure caused by the exfoliation of the resist film CVR is prevented.

In contrast, when the adhesion enhancement process follows the formation of a resist film, the adhesion enhancing agent H is supplied to an edge-cut area of the resist film CVR. This enhances the adhesion between the resist coating film CVT and the substrate surface while failing to enhance the adhesion between the resist film CVR and the substrate surface. That is, an area subjected to no adhesion enhancement (adhesion unenhanced area) is defined between the resist film CVR and the substrate surface. When the resist coating film CVT disappears by exposure process and development process, a developing solution, pure water or the like flowing from the boundary between the end position of the resist film CVR and the substrate surface or from the entire surface of the resist film CVR is absorbed in this adhesion unenhanced area. Hence the resist film CVR is very likely to peel off from the substrate surface. When the adhesion between the resist film CVR and the substrate surface is not enhanced in this condition, the resist film CVR easily peels off to cause development failure. Particularly in light of a tendency in recent years in which the coverage of exposure process is extended to an edge area of a substrate W, part of the resist film CVR defined in the vicinity of the edge of the substrate W may disappear by the exposure process and development process. Then, a developing solution, pure water or the like easily passes therethrough to enter the resist film CVR, resulting in noticeable exfoliation of the resist film CVR. In the above-discussed first embodiment, the adhesion enhancement process precedes the formation of the resist film CVR, thereby enhancing the adhesion between the resist film CVR and the substrate surface. Thus, even in the situation given above, the exfoliation of a resist film is effectively avoided so that development failure is prevented before it occurs.

The covering nozzle 221 is such that, an inert gas is supplied to the inside portion of a substrate W to form a flow of the inert gas from the inside portion toward the periphery, while an adhesion enhancing agent is discharged through the discharge slot 2213 that is opposite the periphery of the substrate W. Thus the adhesion enhancing agent is reliably supplied only onto the periphery of the substrate W.

An irritant substance such as an ammonia component may be generated during adhesion enhancement process. If a processing unit close to the exposure device 17 is responsible for the adhesion enhancement process, a substance generated therefrom may leak out of the substrate processing apparatus 500. In the first embodiment, the adhesion enhancing agent supply part 220 is provided in each thermal processing unit TP of the thermal processors 100 and 101 for anti-reflection films. The thermal processors 100 and 101 for anti-reflection films are arranged well away from the exposure device 17 (see FIG. 1). As a result, the leakage of a substance generated in the adhesion enhancement process out of the substrate processing apparatus 500 is avoided.

Second Embodiment

1. Overall Configuration of Substrate Processing Apparatus

A substrate processing apparatus according to a second embodiment of the present invention is discussed. The substrate processing apparatus of the second embodiment is substantially the same in configuration as the substrate processing apparatus 500 of the first embodiment. A difference therebetween lies in a point that, while a functional part responsible for adhesion enhancement process (adhesion enhancing agent supply part 220) is arranged in each thermal processing unit TP of the thermal processors 100 and 101 for anti-reflection films in the substrate processing apparatus 500 of the first embodiment (see FIG. 6), a functional part responsible for adhesion enhancement process (edge processing solution supply part 330) is arranged in each coating unit BARC of the coating processor 30 for anti-reflection films. This difference is discussed in more detail below. In the discussion below, features that are same as those in the first embodiment are not discussed. Further, FIGS. 1 to 4 are referred to where appropriate, and constituent parts that are same as those in the first embodiment are identified with previously applied reference numerals.

Figure 8:
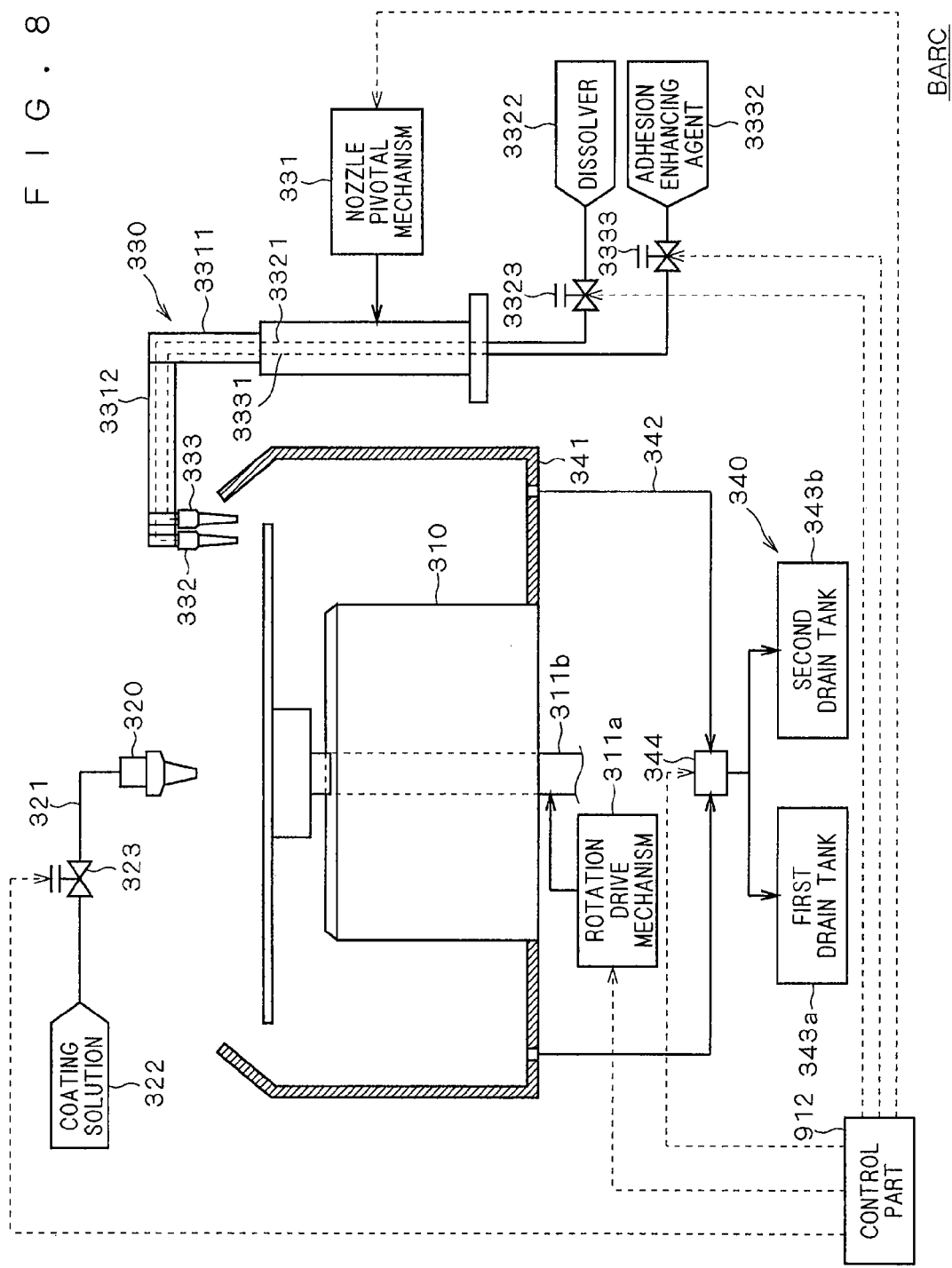
FIG. 8 is a side view showing the structure of a coating unit provided in a coating processor for anti-reflection films.

2. Adhesion Enhancement Process 2-1. Configuration Related to Adhesion Enhancement Process The coating unit BARC provided in the coating processor 30 for anti-reflection films is discussed with reference to FIG. 8. FIG. 8 is a side view showing the structure of the coating unit BARC according to the second embodiment.

The coating unit BARC mainly includes a spin chuck 310 for rotating a substrate W while holding the substrate W in a horizontal position, a coating solution supply nozzle 320 for supplying a coating solution for forming an anti-reflection film onto the upper surface of a substrate W, the edge processing solution supply part 330 for selectively supplying a remover and an adhesion enhancing agent onto the periphery of a substrate W, and a collection part 340 for collecting a residual processing solution supplied to a substrate W. The coating unit BARC further includes a unit controller (control part) 912 responsible for the control of each part in the unit.

Spin Chuck 310

The spin chuck 310 is fixed to an upper end portion of a rotary axis 311b caused to rotate by a rotation drive mechanism 311a. The spin chuck 310 is provided with an air intake path (not shown) that communicates with the upper surface of the spin chuck 310. When the air intake path is exhausted of air with a substrate W being placed on the spin chuck 310, the substrate W is held under suction in a horizontal position on the spin chuck 310. When the rotation drive mechanism 311a is put into operation with a substrate W being held on the spin chuck 310, the spin chuck 310 and the substrate W rotate about a vertical axis passing the center of the substrate W. The rotation drive mechanism 311a is electrically connected to the control part 912. The control part 912 controls the actuation of the rotation drive mechanism 311a to control the on/off of the rotation drive mechanism 311a and the number of revolutions (rotary speed).

Coating Solution Supply Nozzle 320

The coating solution supply nozzle 320 is arranged above the spin chuck 310. A coating solution supply pipe 321 is connected to the coating solution supply nozzle 320. A coating solution supply source 322 for supplying a coating solution for forming an anti-reflection film is provided upstream of the coating solution supply pipe 321. A valve 323 is interposed in the coating solution supply pipe 321. The valve 323 is electrically connected to the control part 912. The control part 912 controls the opening and closing of the valve 323 to supply a coating solution for forming an anti-reflection film from the coating solution supply source 322 through the coating solution supply pipe 321 to the coating solution supply nozzle 320. The coating solution supplied to the coating solution supply nozzle 320 is discharged therefrom to the upper surface of a substrate W held on the spin chuck 310.

Edge Processing Solution Supply Part 330

The edge processing solution supply part 330 mainly includes a nozzle pivotal mechanism 331, a removal nozzle 332 and an adhesion enhancing nozzle 333.

The nozzle pivotal mechanism 331 is formed for example from a pivotal motor, and is arranged at a position lateral to the spin chuck 310. A pivotal axis 3311 extending upward is connected to the nozzle pivotal mechanism 331. A laterally extending arm 3312 is coupled to the pivotal axis 3311. The arm 3312 is provided at its tip end with the removal nozzle 332 and the adhesion enhancing nozzle 333 arranged in juxtaposition. The nozzle pivotal mechanism 331 is electrically connected to the control part 912. The control part 912 controls the actuation of the nozzle pivotal mechanism 331 to cause pivotal movement of the arm 3312. Then the removal nozzle 332 and the adhesion enhancing nozzle 333 attached to the tip end of the arm 3312 are caused to move between a processing position (a position above the periphery of a substrate W held on the spin chuck 310 as shown in FIG. 8), and a retreated position apart from a substrate W to be processed. The control part 912 places the removal nozzle 332 and the adhesion enhancing nozzle 333 at the retreated position for the entry and exit of a substrate W. The control part 912 moves the removal nozzle 332 and the adhesion enhancing nozzle 333 from the retreated position to the processing position for the supply of a processing solution onto the periphery of a substrate W.

A remover supply pipe 3321 is connected to the removal nozzle 332. A remover supply source 3322 for supplying a remover is provided upstream of the remover supply pipe 3321. The remover supply pipe 3321 has a valve 3323 interposed therein partway along its length. The valve 3323 is electrically connected to the control part 912. The control part 912 controls the opening and closing of the valve 3323 to supply a remover from the remover supply source 3322 through the remover supply pipe 3321 to the removal nozzle 332. The remover supplied to the removal nozzle 332 is discharged therefrom onto the periphery of a substrate W held on the spin chuck 310. As an example, an organic solvent such as alcohol capable of dissolving a resist coating film may be used as a remover.

An adhesion enhancing agent supply pipe 3331 is connected to the adhesion enhancing nozzle 333. A adhesion enhancing agent supply source 3332 for supplying an adhesion enhancing agent is provided upstream of the adhesion enhancing agent supply pipe 3331. The adhesion enhancing agent supply pipe 3331 has a valve 3333 interposed therein partway along its length. The valve 3333 is electrically connected to the control part 912. The control part 912 controls the opening and closing of the valve 3333 to supply an adhesion enhancing agent from the adhesion enhancing agent supply source 3332 through the adhesion enhancing agent supply pipe 3331 to the adhesion enhancing nozzle 333. The adhesion enhancing agent supplied to the adhesion enhancing nozzle 333 is discharged therefrom onto the periphery of a substrate W held on the spin chuck 310.

Collection Part 340

The collection part 340 mainly includes a cup 341, two drain tanks 343a and 343b connected through a drain pipe 342 to the cup 341, and a switching valve 344 interposed in the drain pipe 342.

The cup 341 is arranged around the spin chuck 310 in such a way as to enclose a substrate W held on the spin chuck 310. The cup 341 serves to receive a processing solution flying off from a substrate W inside and feed the same to the drain pipe 342. The processing solution fed to the drain pipe 342 is selectively guided to either the drain tank 343a or 343b.

The drain pipe 342 has a branch partway along its length, and is connected downstream of the branch to the drain tanks 343a and 343b. The first drain tank 343a is a container for collecting an adhesion enhancing agent. The second drain tank 343b is a container for collecting a processing solution other than an adhesion enhancing agent. The branch of the drain pipe 342 is provided with the switching valve 344 for opening and closing each of two collection paths defined by the branch. The switching valve 344 is electrically connected to the control part 912. When a processing solution supplied onto a substrate W is an adhesion enhancing agent, the control part 912 switches the switching valve 344 to a state of guiding the collected solution to the first drain tank 343a. When a processing solution supplied onto a substrate W is not an adhesion enhancing agent (coating solution or remover), the control part 912 switches the switching valve 344 to a state of guiding the collected processing solution to the second drain tank 343b.

2-2. Operation at Coating Unit BARC

Next, a series of process steps performed in the coating unit BARC is discussed with reference to FIG. 9. FIG. 9 shows the flow of a series of process steps performed in the coating unit BARC.

First, the second center robot CR2 (see FIG. 1) carries a substrate W into the coating unit BARC, and transfers the same onto the spin chuck 310 (step S21). The substrate W is placed on the spin chuck 310 in such a manner that the center of the substrate W coincides with the center of rotation of the rotary axis 311b, and is fixedly held on the spin chuck 310 by the suction pressure of the air intake path.

After the substrate W is held on the spin chuck 310, coating process for forming an anti-reflection film is performed (step S22). That is, the control part 912 operates the rotation drive mechanism 311a to rotate the substrate W. The control part 912 also opens the valve 323 so that a coating solution for forming an anti-reflection film is discharged from the coating solution supply nozzle 320 onto the upper surface of the substrate W. After the coating solution in certain quantity is supplied to the upper surface of the substrate W, the control part 912 stops the discharge of the coating solution from the coating solution supply nozzle 320 while continuing to rotate the substrate W, thereby forming an anti-reflection film on the surface of the substrate W.

During the process at step S22, the control part 912 controls the switching of the switching valve 344 so that a processing solution flowing from the cup 341 is guided to the second drain tank 343b. Thus, the coating solution flying off from the surface of the substrate W and received inside the cup 341 is collected in the second drain tank 343b.

A next process is the removal of the anti-reflection film defined in the periphery of the substrate W (step S23). That is, the control part 912 operates the nozzle pivotal mechanism 331 to place the removal nozzle 332 and the adhesion enhancing nozzle 333 at the processing position. Then, while rotating the substrate W, the control part 912 opens the valve 3323 so that a remover is discharged from the removal nozzle 332 onto the upper surface of the substrate W. The remover discharged from the removal nozzle 332 is supplied to the periphery of the substrate W to remove the applied coating solution defined in the periphery that is on its way to being stabilized as an anti-reflection film. Thereafter the control part 912 increases the number of revolutions of the substrate W to perform shake dry for removing the remover remaining on the surface of the substrate W which is so-called spin dry.

During the process at step S23, the control part 912 controls the switching of the switching valve 344 so that a processing solution flowing from the cup 341 is guided to the second drain tank 343b. Thus, the remover flying off from the surface of the substrate W and received inside the cup 341 is collected in the second drain tank 343b.

After a certain period of time has elapsed and the process for removing the anti-reflection film defined in the periphery is finished, an adhesion enhancing agent is supplied next onto the periphery of the substrate W from which the anti-reflection film has been removed (step S24). That is, the control part 912 closes the valve 3323 to stop the discharge of the remover. The control part 912 also opens the valve 3333 so that an adhesion enhancing agent is discharged from the adhesion enhancing nozzle 333 onto the periphery of the substrate W. The adhesion enhancing agent discharged from the adhesion enhancing nozzle 333 is supplied to the periphery of the substrate W with a surface exposed by the removal of the anti-reflection film therefrom.

During the process at step S24, the control part 912 controls the switching of the switching valve 344 so that a processing solution flowing from the cup 341 is guided to the first drain tank 343a. Thus, the adhesion enhancing agent flying off from the surface of the substrate W and received inside the cup 341 is collected in the first drain tank 343a.

When the supply of the adhesion enhancing agent to the periphery is finished, the substrate W is carried out of the coating unit BARC by the second center robot CR2 (step S25). Then the series of process steps on one substrate W in the coating unit BARC is completed.

3. Effect

In the substrate processing apparatus according to the above-discussed second embodiment, an adhesion enhancing agent is supplied to the periphery of a substrate W before a resist coating film is formed on the substrate W. This enhances the adhesion between the substrate W at the periphery and a resist coating film, thereby preventing film exfoliation in the vicinity of an edge of the substrate W. Further, as a result of the selective supply of an adhesion enhancing agent only onto the periphery, the number of defects generated is controlled to a low level after development process as compared to the case where an adhesion enhancing agent is applied to a substrate surface in its entirety.

The adhesion enhancement process follows the coating process for forming an anti-reflection film on a substrate W and the removal of the anti-reflection film defined in the periphery. This prevents film exfoliation in the vicinity of an edge of the substrate W while improving efficiency of processing sequence.

The adhesion enhancement process precedes the formation of a resist film. This avoids the exfoliation not only of a resist coating film but also of a resist film. Thus, the generation of development failure is prevented.

An adhesion enhancing agent and a processing solution other than the adhesion enhancing agent are collected in the respective drain tanks 343a and 343b. This prevents the mixing of the collected adhesion enhancing agent with the collected processing solution other than the adhesion enhancing agent, thereby avoiding chemical reaction or solidification of a resin component caused by the mixing.

Modifications

First Modification

In the first embodiment discussed above, the adhesion enhancing agent supply part 220 is provided in the thermal processing unit TP of the thermal processors 100 and 101 for anti-reflection films, and adhesion enhancement process is performed in parallel with thermal process (PAB process) that is performed after the application of a coating solution for forming an anti-reflection film. It is not necessarily required to arrange the adhesion enhancing agent supply part 220 in the thermal processing unit TP of the thermal processors 100 and 101 for anti-reflection films. The adhesion enhancing agent supply part 222 may be provided in an arbitrary one of thermal processing units into which a substrate W is carried before being carried into a processing unit responsible for the application of a coating solution for forming a resist coating film (coating unit COV, FIG. 2). As an example, the adhesion enhancing agent supply part 220 may be provided in the heating units HP and the cooling units CP of the thermal processors 110 and 111 for resist films (FIG. 3). In this case, adhesion enhancement process is performed in parallel with thermal process (process at step S5 in FIG. 4) that follows the process for applying a coating solution for forming a resist film.

Second Modification

In the second embodiment discussed above, the edge processing solution supply part 330 is provided in the coating unit BARC. It is not necessarily required to arrange the edge processing solution supply part 330 in the coating unit BARC. The edge processing solution supply part 330 may be provided in an arbitrary one of various coating units into which a substrate W is carried before being carried into a processing unit responsible for the application of a coating solution for forming a resist coating film (coating unit COV, FIG. 2). As an example, the edge processing solution supply part 330 may be provided in the coating unit RES of the coating processor 40 for resist films (FIG. 2). In this case, adhesion enhancement process is performed after the process for applying a coating solution for forming a resist film and the process for removing the resist film defined in the periphery.

The edge processing solution supply part 330 may alternatively be arranged in the coating unit COV. In this case, adhesion enhancement process precedes the process for applying a coating solution for forming a resist coating film.

Third Modification

In the edge processing solution supply part 330 of the above-discussed second embodiment, the removal nozzle 332 and the adhesion enhancing nozzle 333 respectively serve to release a remover and an adhesion enhancing agent from the upper surface of a substrate W onto its periphery. Alternatively, both the nozzles 332 and 333, or either the nozzle 332 or 333 may be a so-called back rinse nozzle for releasing a processing solution to a substrate W from underneath. In this case, a processing solution (remover or adhesion enhancing agent) discharged from the back rinse nozzle is guided to the upper surface of a substrate W to thereby supply the processing solution to the periphery of the substrate W.

Fourth Modification

In the second embodiment discussed above, the removal nozzle 332 and the adhesion enhancing nozzle 333 are provided to the same arm 3312. Alternatively, the nozzles 332 and 333 may be provided to respective nozzles.

Fifth Modification

In the second embodiment discussed above, an adhesion enhancing agent supplied from the adhesion enhancing agent supply source 3332 is discharged as it is (namely, in the liquid phase) from the adhesion enhancing nozzle 333 (see FIG. 8). Alternatively, an adhesion enhancing agent may be discharged from the adhesion enhancing nozzle 333 in the vapor phase. In this case, the edge processing solution supply part 330 may be given a vaporization processor connected to the adhesion enhancing nozzle 333. As an example, the vaporization processor 222 discussed in the first embodiment (see FIG. 6) may be connected to the adhesion enhancing nozzle 333.

Other Modifications

In each of the embodiments discussed above, the substrate processing apparatus is described as having a plurality of processors. Alternatively, the substrate processing apparatus of the present invention may be a stand-alone apparatus comprising only a thermal processing unit with a function of adhesion enhancement, or a coating processing unit with a function of adhesion enhancement.

In each of the embodiments discussed above, a semiconductor substrate W is a target for processing. Alternatively, in the substrate processing apparatus of the present invention, other types of substrates such as a glass substrate for a liquid crystal display device or a glass substrate for a photomask may be subjected to processing.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus arranged adjacent to an exposure device, wherein:
    a resist film is formed on an upper surface of a substrate; then
    a resist coating film is formed on an upper surface of the substrate; and
    the substrate is transferred to the exposure device,
    the substrate processing apparatus comprising:
    a processor with a plurality of processing units arranged therein that are responsible for certain processes on the substrate, the plurality of processing units including a post-coating thermal processing unit responsible for thermal processing of the substrate after a certain coating solution has been applied to the upper surface of the substrate, the post-coating thermal processing unit having:
        an adhesion enhancing agent supply element for supplying an adhesion enhancing agent only to a periphery of the substrate before formation of the resist coating film; and
        a thermal processing plate for performing thermal processing of the substrate while supporting the substrate by an upper surface of the thermal processing plate;
    a partition wall configured to partition space inside a cover, covering an inside portion of the substrate while excluding a periphery of the substrate;
    an inert gas supply element for supplying an inert gas from inside the partition wall to the inside portion of the substrate;
    wherein the adhesion enhancing agent supply element is provided with a cover for covering a substrate supported by the thermal processing plate;
    a discharge slot communicating with a feed path defined inside the cover and outside the partition wall while being opposite the periphery of the substrate, and
    the adhesion enhancing agent guided along the feed path is discharged through the discharge slot toward the periphery of the substrate; and
    a transfer part for transferring the substrate between the processor and the exposure device.

2. The substrate processing apparatus according to claim 1 further comprising:
    a control element for controlling each constituent of the post-coating thermal processing unit, the control element causing the adhesion enhancing agent supply element to supply the adhesion enhancing agent onto a periphery of the substrate while the thermal process is being performed on the substrate.

3. The substrate processing apparatus according to claim 1 wherein the certain coating solution serves to form an anti-reflection film.

4. The substrate processing apparatus according to claim 1 wherein the certain coating solution serves to form a resist film.

5. The substrate processing apparatus according to claim 1 wherein
    the adhesion enhancing agent supply element is provided with a vaporization element for vaporizing the adhesion enhancing agent, and
    the adhesion enhancing agent is supplied in the vapor phase to the periphery of the substrate.

* * * * *